(12) United States Patent
Caviglia et al.

(10) Patent No.: US 8,384,453 B1
(45) Date of Patent: Feb. 26, 2013

(54) FREQUENCY ADJUSTMENT IN A CONTROL SYSTEM

(75) Inventors: Anthony Louis Caviglia, Marriottsville, MD (US); Eric Harris Naviasky, Ellicott City, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/431,460

(22) Filed: Mar. 27, 2012

(51) Int. Cl.
*H03L 7/06* (2006.01)
(52) U.S. Cl. ........................ 327/156; 327/147
(58) Field of Classification Search .................. 327/147, 327/156
See application file for complete search history.

(56) References Cited

U.S. PATENT DOCUMENTS

| | | | | |
|---|---|---|---|---|
| 5,857,004 A * | 1/1999 | Abe | ............................. | 375/344 |
| 7,447,489 B2 * | 11/2008 | Lim | ........................... | 455/191.1 |
| 8,242,818 B2 * | 8/2012 | Kim et al. | ..................... | 327/156 |
| 2009/0195239 A1 * | 8/2009 | Doi et al. | .................... | 324/76.19 |
| 2011/0148484 A1 * | 6/2011 | Kim et al. | ..................... | 327/148 |
| 2012/0038400 A1 * | 2/2012 | Talaga, Jr. | ..................... | 327/156 |

* cited by examiner

*Primary Examiner* — Adam Houston
(74) *Attorney, Agent, or Firm* — Holland & Knight LLP; Mark H. Whittenberger, Esq.

(57) ABSTRACT

The present disclosure relates to a method, apparatus, and system for locking a phase locked loop (PLL). The method may include receiving a reference signal at a phase locked loop (PLL) circuitry having a first PLL circuitry and a second PLL circuitry. The first PLL circuitry may include a fixed frequency oscillator. The method may further include adjusting a division ratio using, at least in part, a fractional divider circuitry in communication with the fixed frequency oscillator, to generate a feedback signal having a substantially equal frequency and a substantially equal phase in relation to a reference frequency. The method may also include receiving the feedback signal and the reference frequency at a phase detector.

21 Claims, 3 Drawing Sheets

FREQUENCY ADJUSTMENT IN A CONTROL SYSTEM

TECHNICAL FIELD

The present disclosure relates to frequency adjustment, and more specifically, to a phase locked loop (PLL) control system that may eliminate the requirement of a voltage controlled oscillator (VCO) in one or more phase locked loops (PLLs).

BACKGROUND

Some conventional PLLs lock a voltage controlled oscillator (VCO) to an externally provided reference frequency. In some systems, VCO output is divided before being compared to the reference frequency. The PLL locks the VCO to a multiple of the reference frequency. In these systems, this locking is accomplished by adjusting a control voltage of the VCO until a phase of a divider output matches a phase of the reference. Once the phases match, the frequency ratio must match the divider value.

BRIEF SUMMARY

In an embodiment, a method for locking a phase locked loop (PLL) is provided. The method includes receiving a reference signal at a phase locked loop (PLL) circuitry having a first PLL circuitry and a second PLL circuitry. The first PLL circuitry includes a fixed frequency oscillator. The method further includes adjusting a division ratio using, at least in part, a fractional divider circuitry in communication with the fixed frequency oscillator, to generate a feedback signal having a substantially equal frequency and a substantially equal phase in relation to a reference frequency. The method also includes receiving the feedback signal and the reference frequency at a phase detector.

One or more of the following features may be included. The method may further include controlling the fractional divider circuitry based upon, at least in part, an output of a digital loop filter circuitry. The fractional divider circuitry may include a feedback divider circuitry and a delta sigma modulator circuitry. The method may further include determining an appropriate multiplication value for the second PLL circuitry based upon, at least in part, a fractional divider control signal.

In an implementation, method may include receiving at an inverse circuitry, one or more inputs, based upon, at least in part, the fractional divider control signal. The method may also include receiving a digital signal from the inverse circuitry at a multiplier circuitry. The method may additionally include receiving a digital signal from the multiplier circuitry at the second PLL circuitry and using the digital signal, at least in part, as a second PLL feedback divider control signal.

In an embodiment, an apparatus is configured to lock one or more phase locked loops (PLLs) is provided. The apparatus includes a circuit configured to receive a reference signal at a phase locked loop (PLL) circuitry having a first PLL circuitry and a second PLL circuitry. The first PLL circuitry includes a fixed frequency oscillator. The circuit is further configured to adjust a division ratio using, at least in part, a fractional divider circuitry in communication with the fixed frequency oscillator, to generate a signal having a substantially equal frequency and a substantially equal phase in relation to a reference frequency. The circuit is additionally configured to receive the feedback signal and the reference frequency at a phase detector.

One or more of the following features may be included. The circuit may be configured to control the fractional divider circuitry based upon, at least in part, an output of a digital loop filter circuitry. The fractional divider circuitry may include a feedback divider circuitry and a delta sigma modulator circuitry. The circuit also may be configured to determine an appropriate multiplication value for the second PLL circuitry based upon, at least in part, a fractional divider control signal.

In an implementation, the circuit may be configured to receive at an inverse circuitry, one or more inputs, based upon, at least in part, the fractional divider control signal. The circuit may also be configured to receive a digital signal from the inverse circuitry at a multiplier circuitry. The circuit may additionally be configured to receive a digital signal from the multiplier circuitry at the second PLL circuitry and use the digital signal, at least in part, as a second PLL feedback divider control signal.

In an embodiment of the present disclosure, a system is configured to lock one or more phase locked loops (PLLs). The system includes a phase locked loop (PLL) circuitry configured to receive a reference signal, the PLL circuitry having a first PLL circuitry and a second PLL circuitry. The first PLL circuitry includes a fixed frequency oscillator. The system also includes a fractional divider circuitry in communication with the fixed frequency oscillator configured, at least in part, to adjust a division ratio and generate a feedback signal having a substantially equal frequency and a substantially equal phase in relation to a reference frequency. The system additionally includes a phase detector configured to receive the feedback signal and the reference frequency.

One or more of the following features may be included. The system may be configured to control the fractional divider circuitry based upon, at least in part, an output of a digital loop filter circuitry. The fractional divider circuitry may include a feedback divider circuitry and a delta sigma modulator circuitry. The system may also be configured to determine an appropriate multiplication value for the second PLL circuitry based upon, at least in part, a fractional divider control signal.

In an implementation, the system may be configured to receive at an inverse circuitry, one or more inputs, based upon, at least in part, the fractional divider control signal. The system may also be configured to receive a digital signal from the inverse circuitry at a multiplier circuitry. The system may additionally be configured to receive a digital signal from the multiplier circuitry at the second PLL circuitry and use the digital signal, at least in part, as a second PLL feedback divider control signal.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings are included to provide a further understanding of one or more embodiments of the present disclosure. They are incorporated herein and consti

DETAILED DESCRIPTION

Reference will now be made in detail to one or more embodiments of the present disclosure, examples of which are illustrated in the accompanying drawings. The present disclosure may, however, be embodied in many different forms and should not be construed as being limited to the one or more embodiments set forth herein. Rather, the one or more embodiments are provided so that this disclosure will be thorough and complete, and will fully convey the concept of the disclosure to those skilled in the art.

As discussed above, the present disclosure generally relates to frequency adjustment in a control system, and more specifically to systems and methods for a phase locked loop (PLL) control system that may eliminate the requirement of a voltage controlled oscillator (VCO) in one or more PLLs.

As used herein, the term "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in one or more embodiments herein may be implemented in software, firmware, hardwired circuitry and/or any combination thereof.

The term "integrated circuit" (IC), as used herein, may refer to a semiconductor device and/or microelectronic device, such as, for example, but not limited to, a semiconductor integrated circuit chip, field programmable gate array (FPGA), or the like.

Numerous additional and/or alternative configurations are also within the scope of the present disclosure.

In some systems, the constraints of output frequency range and noise cannot be met by a single PLL but may be met by a cascade of two PLLs. The first PLL may include a voltage controlled oscillator and may provide a fixed frequency that is higher than the reference. The existence of this high frequency signal may relax the constraints and a second PLL may be able to use it to meet system requirements. In these systems, the output frequency is the reference frequency times the multiplication factors of both PLLs. Depending on precise requirements, one or both PLLs may be a fractional design where the feedback divider is varied to give an average value that is not an integer.

It should be noted that these cascaded systems including two PLLs may include two voltage controlled oscillators. Further, each PLL may include a voltage controlled oscillator. These systems with more than one voltage controlled oscillator may use a relatively large amount of power, may require a relatively large amount of design-time, and may have a relatively high cost.

Figure 1:
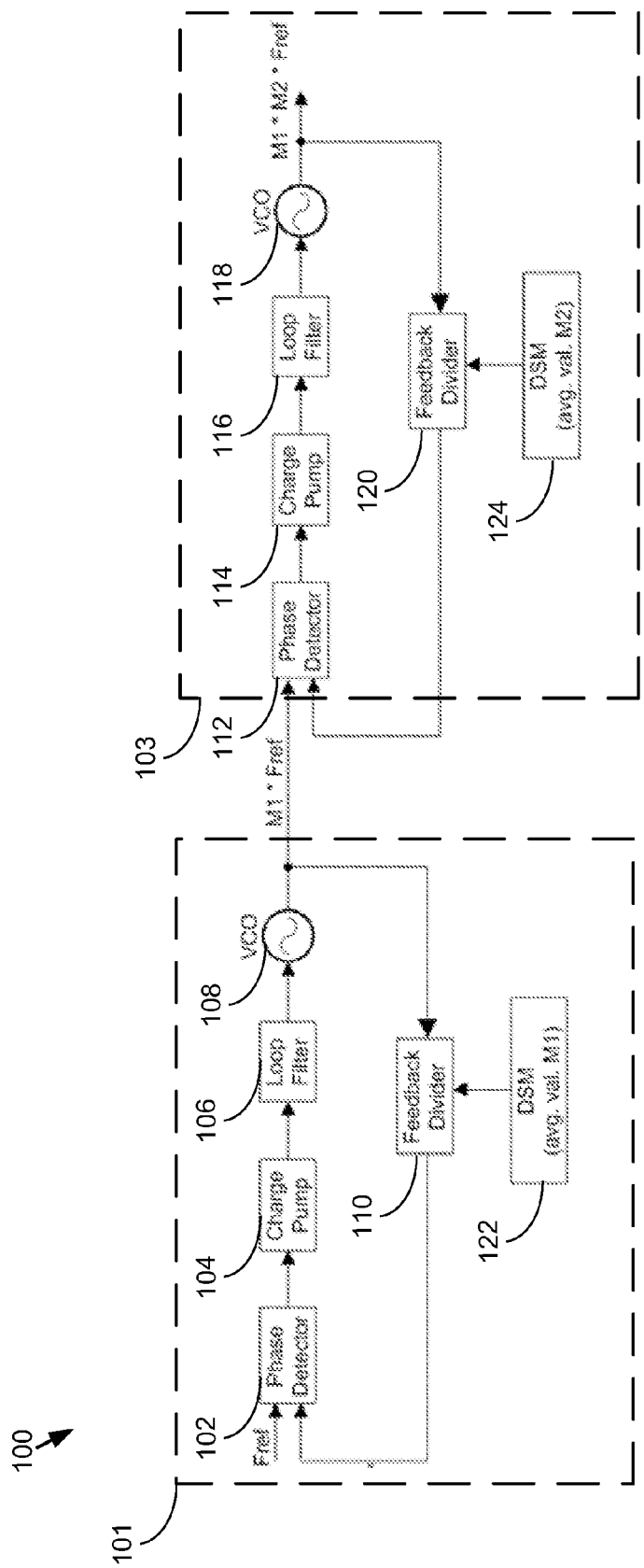
- FIG. 1 is a system diagram depicting aspects of a frequency adjustment system.

For example, and referring now to FIG. 1, an example system depicting two cascaded PLLs (e.g., PLL circuitry 100) is provided. PLL circuitry 100 may include one or more PLL circuitries (e.g., first PLL circuitry 101 and second PLL circuitry 103), which may be operatively connected in a cascading manner. PLL circuitry 101 may include a phase detector 102 which may be configured to receive one or more input signals and/or reference signals and to generate an error signal, which may be proportional to the phase difference between two signals. The output of phase detector 102 may be received at charge pump 104, which may be configured to add a pole at the origin in a loop transfer function of the phase locked loop.

Further, in some systems, charge pump 104 may be operatively connected with loop filter 106, which may be configured to act as a low-pass filter. The output of loop filter 106 may be used to drive voltage controlled oscillator (VCO) 108. VCO 108 may be configured to generate an output phase based upon the input from loop filter 106. VCO 108 may be operatively connected to feedback divider 110, which may be configured to produce a negative feedback loop by generating an output, which may be delivered back to phase detector 102. Feedback divider 110 may also be in communication with one or more delta-sigma modulators 122.

In some systems, PLL circuitry 103 may include phase detector 112, charge pump 114, loop filter 116, voltage controlled oscillator 118, feedback divider 120 and delta-sigma modulator 124.

In some systems, the required tuning range for first PLL circuitry 101 may be difficult or impossible to achieve. For example, if first PLL circuitry 101 uses a crystal oscillator (e.g., a voltage controlled crystal oscillator), the tuning range may be very restricted. As such, it may not be possible to lock the crystal oscillator (e.g., VCO 108) to the desired multiple of the reference frequency if the reference frequency varies even a small amount.

For example, assume for illustrative purposes that a system may require that a radio frequency integrated circuit (RFIC) design recover a very low noise (e.g. 10 MHz) reference from a noisy (e.g. 10 MHz) signal on a wire interface. The recovered reference may be used by other PLLs on the chip. In some systems, a discrete design may use a PLL to lock a voltage controlled crystal oscillator (VCXO) to the noisy reference. In this example, the VCXO tuning range must be sufficient to correct for the difference in the frequencies between the noisy reference and the center frequency of the VCXO. In this case the difference is about 50 parts per million (ppm). Designing an integrated VCXO with such a tuning range may be impractical. One workaround in this case may be to use an external VCXO. This would likely come at a significant additional cost.

However, in some cascaded PLL systems, the actual frequency of the first PLL may not be critical as long as the frequency of the first PLL is known. In one or more embodiments of the present disclosure, a multiplication factor of the second PLL can be adjusted such that the output frequency is correct. In these cascaded PLL systems and others, the first PLL may operate with a fixed frequency oscillator instead of, e.g., a voltage controlled oscillator. Utilizing a fixed frequency oscillator in such systems and others may allow designers to save power, design-time, and cost.

Figure 2:
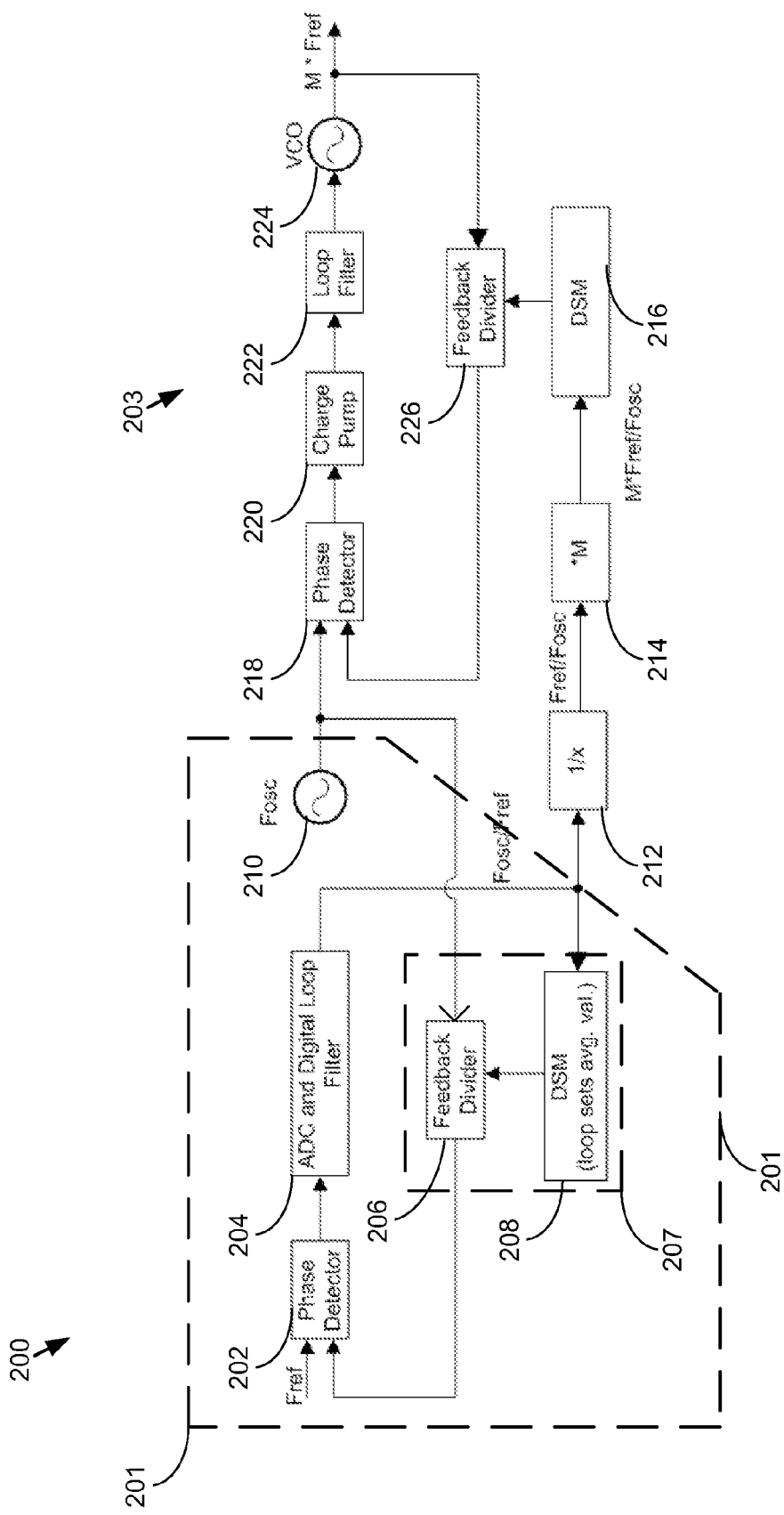
FIG. 2 is also system diagram depicting aspects of a frequency adjustment system.

Referring now to FIG. 2, an example embodiment of the present disclosure depicting PLL circuitry 200 is provided. In an embodiment, the present disclosure recognizes that the exact frequency of first PLL circuitry 201 is not critical, as long as its frequency is known, and as long as the multiplication factor of second PLL circuitry 203 may be adjusted so that the output frequency is correct. As discussed above, first PLL circuitry 201 may operate with a fixed frequency oscillator. Instead of locking first PLL circuitry 201 by varying the oscillator frequency (via, e.g., a VCO), the first PLL circuitry 201 may be locked by varying the feedback divider value.

Continuing with the example above, once first PLL circuitry 201 is locked, the exact ratio between the reference frequency and the fixed frequency oscillator may be given by the feedback divider value. From that value an appropriate multiplication factor for second PLL circuitry 203 can be determined so that the product of both factors is the desired overall multiplication factor. Both first PLL circuitry 201 and second PLL circuitry 203 may be fractional designs. In this way, first PLL circuitry 201 may be configured to lock the unknown oscillator frequency and second PLL circuitry 203 may be configured to correct for the uncertainty of the frequency of first PLL circuitry 201.

It should be noted that because the oscillator in first PLL circuitry 201 does not need to change its frequency, fixed frequency oscillator circuitry 210 can be used, which may result in a simpler oscillator design. In systems where the required tuning range for the first voltage controlled oscillator (VCO) cannot be met, the present disclosure provides a solution where none existed.

In an example embodiment, PLL circuitry 200 may include PLL circuitry 201 and PLL circuitry 203, which may be configured in a cascading manner similar to that shown in FIG. 1. PLL circuitry 201 may include phase detector circuitry 202, analog-to-digital converter (ADC) and digital loop filter circuitry 204. PLL circuitry 201 may further include fractional divider circuitry 207, which may include feedback divider circuitry 206 and delta sigma modulator circuitry 208. As discussed above, PLL circuitry 201 may also include fixed frequency oscillator circuitry 210, which is described in further detail below.

In an example embodiment, PLL circuitry 203 may include phase detector circuitry 218, charge pump 220, and loop filter circuitry 222. PLL circuitry 203 may further include feedback divider circuitry 226 and delta sigma modulator circuitry 216. As discussed above, PLL circuitry 203 may also include oscillator circuitry 224, which may be a voltage controlled oscillator.

In an example embodiment, PLL circuitry 200 may be configured to adjust a division ratio using, at least in part, fractional divider circuitry 207 to generate a feedback signal having a substantially equal frequency and a substantially equal phase in relation to the reference frequency (of, e.g., a reference signal) entering phase detector circuitry 202. This generated feedback signal may be sent to phase detector circuitry 202 as well. The division ratio may be the ratio of the fixed oscillator frequency to the feedback signal frequency. The term "substantially" is used in the present disclosure to indicate that the frequency and phase may not be necessarily absolutely identical and may vary slightly (e.g. sensing resolution of testing equipment, etc.).

In an example embodiment, fractional divider circuitry 207 may receive one or more signals from ADC and digital loop filter circuitry 204. Filter circuitry 204 may be configured to control the operation of fractional divider circuitry 207. Fractional divider circuitry 207 may include feedback divider circuitry 206 and delta sigma modulator (DSM) circuitry 208.

In an example embodiment, feedback divider circuitry 206 may be configured to receive a fixed frequency signal ($F_{osc}$) from fixed frequency oscillator 210 and to divide the fixed frequency signal by a number generated by DSM circuitry 208. In some embodiments, DSM circuitry 208 may be configured to receive one or more signals (e.g. $F_{osc}/F_{ref}$) and to convert a digital number into a sequence of integers, which may be provided to feedback divider circuitry 206.

In an example embodiment, second PLL circuitry 203 may include inverter circuitry 212 and multiplier circuitry 214. In this way, inverter circuitry 212 may be configured to receive a signal (e.g. $F_{osc}/F_{ref}$) and to generate an inverted signal (e.g., $F_{ref}/F_{osc}$). The input signal received by inverter circuitry 212 may be at least partially based upon the signal ($F_{osc}$) generated by fixed frequency oscillator 210. The inverted signal (e.g., $F_{ref}/F_{osc}$) generated by inverter circuitry 212 may be digital in nature and may be sent to multiplier circuitry 214 as is depicted in FIG. 2. Multiplier circuitry 214 may be configured to multiply the output signal from inverter circuitry 212 and to generate a multiplied signal (e.g. $M*F_{ref}/F_{osc}$), which may be received at second DSM circuitry 216.

In an example embodiment, PLL circuitry 200 may be configured to determine an appropriate multiplication value for second PLL circuitry 203 based upon, at least in part, a feedback divider value from fractional divider circuitry 207, such that the second PLL circuitry 203 produces the desired frequency. The desired frequency may be the output frequency from PLL circuitry 203 or the VCO frequency.

The teachings and/or embodiments of the present disclosure may be used a wide variety of applications. For example, they may be included in any suitable system or application including, but not limited to, serialization/deserialization applications, communications systems, test equipment, etc.

Figure 3:
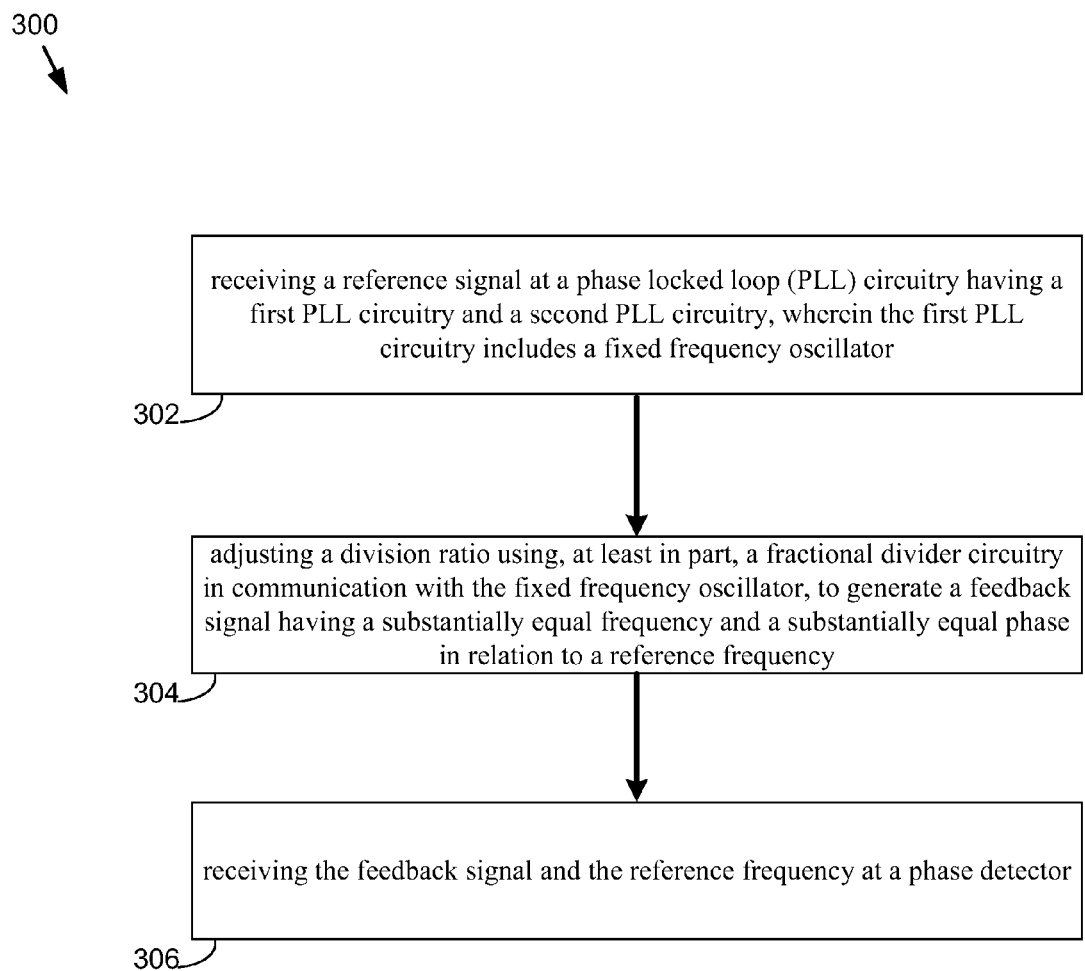
FIG. 3 is a flowchart depicting operations consistent with one or more frequency adjustment systems.

Referring now to FIG. 3, a flowchart 300 depicting example operations associated with the present disclosure is provided. Operations may include receiving 302 a reference signal at a phase locked loop (PLL) circuitry having a first PLL circuitry and a second PLL circuitry, wherein the first PLL circuitry includes a fixed frequency oscillator. Operations may further include adjusting 304 a division ratio using, at least in part, a fractional divider circuitry in communication with the fixed frequency oscillator, to generate a feedback signal having a substantially equal frequency and a substantially equal phase in relation to a reference frequency. Operations may also include receiving 306 the feedback signal and the reference frequency at a phase detector.

One or more embodiments of the methods described above may be implemented in a computer program that may be stored on a storage medium having instructions to program a system to perform the methods. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic operations. Other embodiments may be implemented as software modules executed by a programmable control device.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A method for locking a phase locked loop (PLL), the method comprising:

receiving a reference signal at a phase locked loop (PLL) circuitry having a first PLL circuitry and a second PLL circuitry, wherein the first PLL circuitry includes a fixed frequency oscillator;

adjusting a division ratio using, at least in part, a fractional divider circuitry in communication with the fixed frequency oscillator, to generate a feedback signal having a substantially equal frequency and a substantially equal phase in relation to a reference frequency; and receiving the feedback signal and the reference frequency at a phase detector.

2. The method of claim 1, further comprising:
controlling the fractional divider circuitry based upon, at least in part, an output of a digital loop filter circuitry.

3. The method of claim 1, wherein the fractional divider circuitry includes a feedback divider circuitry and a delta sigma modulator circuitry.

4. The method of claim 1, further comprising:
determining an appropriate multiplication value for the second PLL circuitry based upon, at least in part, a fractional divider control signal.

5. The method of claim 4, further comprising:
receiving at an inverse circuitry, one or more inputs, based upon, at least in part, the fractional divider control signal.

6. The method of claim 5, further comprising:
receiving a digital signal from the inverse circuitry at a multiplier circuitry.

7. The method of claim 6, further comprising:
receiving a digital signal from the multiplier circuitry at the second PLL circuitry and using the digital signal, at least in part, as a second PLL feedback divider control signal.

8. An apparatus configured to lock one or more phase locked loops (PLLs), the apparatus comprising:
a circuit configured to:
receive a reference signal at a phase locked loop (PLL) circuitry having a first PLL circuitry and a second PLL circuitry, wherein the first PLL circuitry includes a fixed frequency oscillator;
adjust a division ratio using, at least in part, a fractional divider circuitry in communication with the fixed frequency oscillator, to generate a signal having a substantially equal frequency and a substantially equal phase in relation to a reference frequency; and
receive the feedback signal and the reference frequency at a phase detector.

9. The apparatus of claim 8, wherein the circuit is further configured to:
control the fractional divider circuitry based upon, at least in part, an output of a digital loop filter circuitry.

10. The apparatus of claim 8, wherein the fractional divider circuitry includes a feedback divider circuitry and a delta sigma modulator circuitry.

11. The apparatus of claim 10, wherein the circuit is further configured to:
determine an appropriate multiplication value for the second PLL circuitry based upon, at least in part, a fractional divider control signal.

12. The apparatus of claim 11, wherein the circuit is further configured to:
receive at an inverse circuitry, one or more inputs, based upon, at least in part, the fractional divider control signal.

13. The apparatus of claim 12, wherein the circuit is further configured to:
receive a digital signal from the inverse circuitry at a multiplier circuitry.

14. The apparatus of claim 13, wherein the circuit is further configured to:
receive a digital signal from the multiplier circuitry at the second PLL circuitry and use the digital signal, at least in part, as a second PLL feedback divider control signal.

15. A system configured to lock one or more phase locked loops (PLLs), the system comprising:
a phase locked loop (PLL) circuitry configured to receive a reference signal, the PLL circuitry having a first PLL circuitry and a second PLL circuitry, wherein the first PLL circuitry includes a fixed frequency oscillator;
a fractional divider circuitry in communication with the fixed frequency oscillator configured, at least in part, to adjust a division ratio and generate a feedback signal having a substantially equal frequency and a substantially equal phase in relation to a reference frequency; and
a phase detector configured to receive the feedback signal and the reference frequency.

16. The system of claim 15, wherein the system is further configured to:
control the fractional divider circuitry based upon, at least in part, an output of a digital loop filter circuitry.

17. The system of claim 15, wherein the fractional divider circuitry includes a feedback divider circuitry and a delta sigma modulator circuitry.

18. The system of claim 17, wherein the system is further configured to:
determine an appropriate multiplication value for the second PLL circuitry based upon, at least in part, a fractional divider control signal.

19. The system of claim 18, wherein the system is further configured to:
receive at an inverse circuitry, one or more inputs, based upon, at least in part, the fractional divider control signal.

20. The system of claim 19, wherein the system is further configured to:
receive a digital signal from the inverse circuitry at a multiplier circuitry.

21. The system of claim 20, wherein the system is further configured to:
receive a digital signal from the multiplier circuitry at the second PLL circuitry and use the digital signal, at least in part, as a second PLL feedback divider control signal.

* * * * *